United States Patent [19]
Baker et al.

[11] Patent Number: 5,024,971
[45] Date of Patent: Jun. 18, 1991

[54] METHOD FOR PATTERNING SUBMICRON OPENINGS USING AN IMAGE REVERSAL LAYER OF MATERIAL

[75] Inventors: Frank K. Baker; James D. Hayden, both of Austin, Tex.

[73] Assignee: Motorola, Inc., Schaumburg, Ill.

[21] Appl. No.: 570,180

[22] Filed: Aug. 20, 1990

[51] Int. Cl.⁵ .......................................... H01L 21/465
[52] U.S. Cl. ...................................... 437/228; 437/31; 437/40; 437/41; 437/238; 437/241; 148/DIG. 105; 148/DIG. 147; 156/652; 156/644
[58] Field of Search ................. 156/652; 437/40, 200, 437/238, 241, 228, 911, 41, 31; 148/DIG. 105, DIG. 106, DIG. 147

[56] References Cited

U.S. PATENT DOCUMENTS

| | | | |
|---|---|---|---|
| 4,378,627 | 4/1983 | Jambotkar | 437/40 |
| 4,455,738 | 6/1984 | Houston et al. | 437/912 |
| 4,472,872 | 9/1984 | Toyoda et al. | 437/912 |
| 4,689,869 | 9/1987 | Jambotkar | 437/44 |
| 4,735,681 | 4/1988 | Alvarez | 156/652 |
| 4,784,718 | 11/1988 | Mitani et al. | 437/238 |
| 4,855,247 | 8/1989 | Ma et al. | 437/200 |

FOREIGN PATENT DOCUMENTS 0113161  7/1984  European Pat. Off. ............ 437/912

OTHER PUBLICATIONS

C. Johnson et al., "Method of Making Submicron Dimensions in Structures Using Sidewall Image Transfer Techniques", *IBM Technical Disclosure Bulletin*, vol. 26, No. 9, Feb. 1984, pp. 4587–4589.

*Primary Examiner*—Brian E. Hearn
*Assistant Examiner*—Laura M. Holtzman
*Attorney, Agent, or Firm*—Robert L. King

[57] ABSTRACT

The invention provides a method for patterning a submicron opening in a layer of semiconductor material. The method comprises use of conventional photolithography to position a sidewall spacer in a predetermined location on a semiconductor device. A layer of cobalt is selectively reacted with an underlying layer to form an image reversal layer which functions as a hard mask. The submicron features are then transferred into the underlying layer of semiconducting material by etching.

16 Claims, 5 Drawing Sheets

METHOD FOR PATTERNING SUBMICRON OPENINGS USING AN IMAGE REVERSAL LAYER OF MATERIAL

TECHNICAL FIELD

The present invention generally relates to semiconductor devices, and more particularly to a method for patterning submicron openings in such devices.

BACKGROUND OF THE INVENTION

In the mass production of semiconductor products, optical photolithographic systems are typically used to pattern layers of material that form the semiconductor devices. State of the art photolithographic systems, as used in the mass production of semiconductor products, generally have a resolution capability of no less than 0.5 micron.

A known method for resolving pattern line features having a minimum dimension of less than 0.5 micron by using conventional photolithography is achieved by use of a "spacer sidewall deposition" or a "spacer". The spacer method uses conventional photolithography to position a pattern line feature in a first layer of a material which overlies a layer of a semiconductor device to be etched. Subsequently, a conformal material is deposited to overlie the patterned first layer and is anisotropically etched to leave a remnant of the conformal material, known as the spacer, which is integral with and situated along the edges of the pattern line feature in the first layer. If the material of the line feature is selectively etched with respect to the spacer material, a pattern of spacers is formed on the layer or the semiconductor device to be etched. The spacer feature has a minimum dimension in the submicron range of 0.05 to 0.5 micron depending upon the original thickness of the conformal layer. In this manner, a spacer can function as a secondary etching mask for the layer of the semiconductor device to be etched. The pattern of spacers, overlying the layer of the semiconductor device to be etched, is etched anisotropically with an etch process that selectively etches the layer of the semiconductor device rather than the spacers. The resulting pattern lines which are a positive image of the pattern of spacers are etched into the first layer of material and have a much greater resolution than that which could be formed by conventional photolithographic systems. The aforementioned method has many applications for the patterning of submicron lines in the production of semiconductor products. Moreover, in addition to the patterning of submicron lines, there are also many applications in the semiconductor industry, such as in the manufacture of bipolar devices, for the patterning of submicron openings. Unfortunately, conventional photolithography does not have sufficient resolution capability to pattern submicron lines or openings.

A method for forming a submicron trench is taught by Antonio Alvarez in U.S. Pat. No. 4,735,681 entitled "Fabrication Method For Sub-Micron Trench" and assigned to the assignee hereof. Spacer material is used to form a hole in a masking layer which is subsequently transferred into an underlying substrate.

SUMMARY OF THE INVENTION

Briefly, the present invention provides a method for the patterning of submicron openings in a first layer of material of a semiconductor device. The method comprises patterning a second layer of material, overlying the first layer of material, to form windows in the second layer of material having a first dimension. Conventional spacer methods are used to form at least one side wall spacer from a third layer of material, which is formed along an edge of the window in the second layer of material. The second layer of material is selectively etched to leave at least one sidewall spacer substantially intact. A fourth layer of material is deposited and selectively reacts with exposed regions of the second layer of material which is not masked by a spacer to form a hard mask. The fourth layer of material, overlying the spacer, does not react with the third layer of material from which the spacer is formed. Conventional chemical etching is used to remove unreacted portions of the fourth layer of material overlying the spacers and a subsequent etching process also removes the at least one sidewall spacer. The removal of the unreacted material and the at least one spacer exposes a predetermined portion of the first layer of material having a second dimension less than the first dimension. The second dimension is less than that achievable by conventional photolithographic systems. Anisotropic etching is used to selectively etch the first layer, where exposed, with an etch process that does not etch the material of the hard mask provided by the reacted fourth layer of material, to form a submicron opening in the first layer of material.

These and other features and advantages will be more clearly understood from the following detailed description taken in conjunction with the accompanying drawings.

DETAILED DESCRIPTION OF THE INVENTION

State of the art photolithographic processes, as used in the mass production of semiconductor products, typically have a resolution capability of no less than 0.5 micron. The previously mentioned known spacer method uses conventional photolithography to position a spacer over a layer of a semiconductor device to be etched. The spacer is a topographical feature of material that can function as an etch mask in a subsequent etching process step.

Figure 1A:
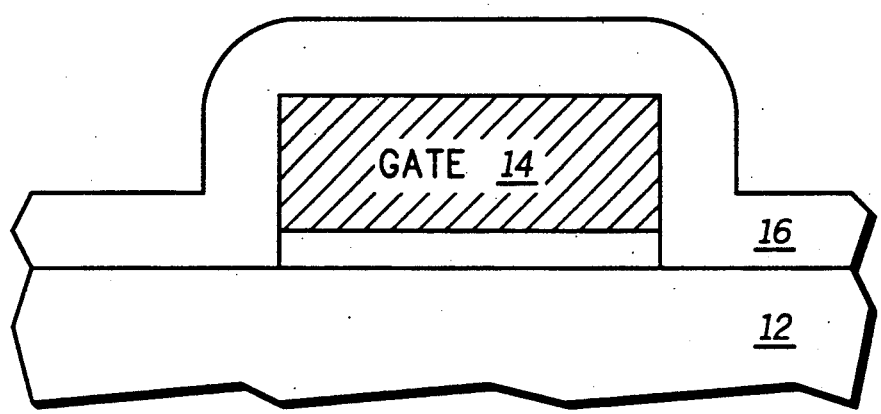
FIGS. 1(A-B) illustrate, in cross-sectional form, a known spacer sidewall deposition process using photolithography in the manufacture of a semiconductor device.

FIG. 1A illustrates, in cross-sectional form, a portion of a known semiconductor device 10 having a substrate 12 and an overlying polysilicon gate 14. A conformal material 16, such as a chemically deposited oxide, has been deposited to overlie gate 14. Typically, an insulating oxide layer (not numbered) of material is interposed between gate 14 and substrate 12.

Figure 1B:
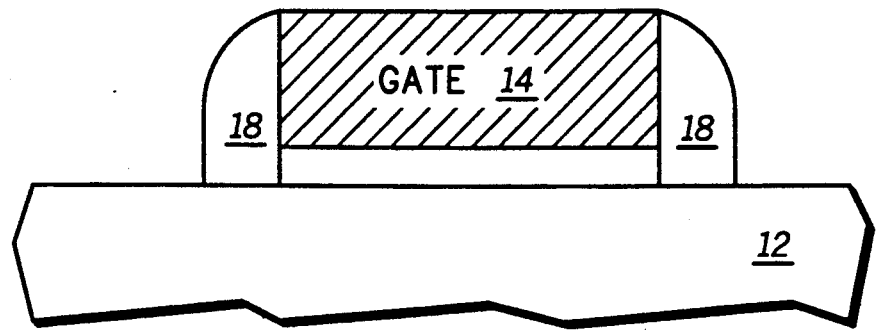

FIG. 1B illustrates, in cross-sectional form, further processing o device 10. Device 10 has been anisotropically etched to leave a remnant of material, known as spacers 18, which are formed from conformal material 16 along the sidewalls of gate 14.

In the illustrated form, spacers 18 define sides of a patterned line which functions as gate 14. The dimension of gate 14 between spacers 18 is determined by photolithographic equipment used to pattern gate 14. The advantage of spacer technology is that the spacer dimension is independent of the resolution of photolithographic systems. Since the relative positioning of the spacer onto a circuit in most applications does not challenge the resolution capability of the photolithographic systems, the aforementioned method has a broad range of applications in the semiconductor industry. A disadvantage of the spacer method, as previously described, is its limitation to patterning only line features on a layer of semiconductor material.

FIGS. 2(A-H) illustrate a method for patterning submicron openings in accordance with the present invention. Particular emphasis is placed upon the application of the method of the present invention to the manufacture of a portion of a bipolar semiconductor device. As discussed below, the invention uses an image reversal layer in a semiconductor. The image reversal layer is a layer of material having novel chemical properties which are extremely advantageous to the formation of semiconductor transistors in bipolar and BICMOS processes.

Figure 2A:
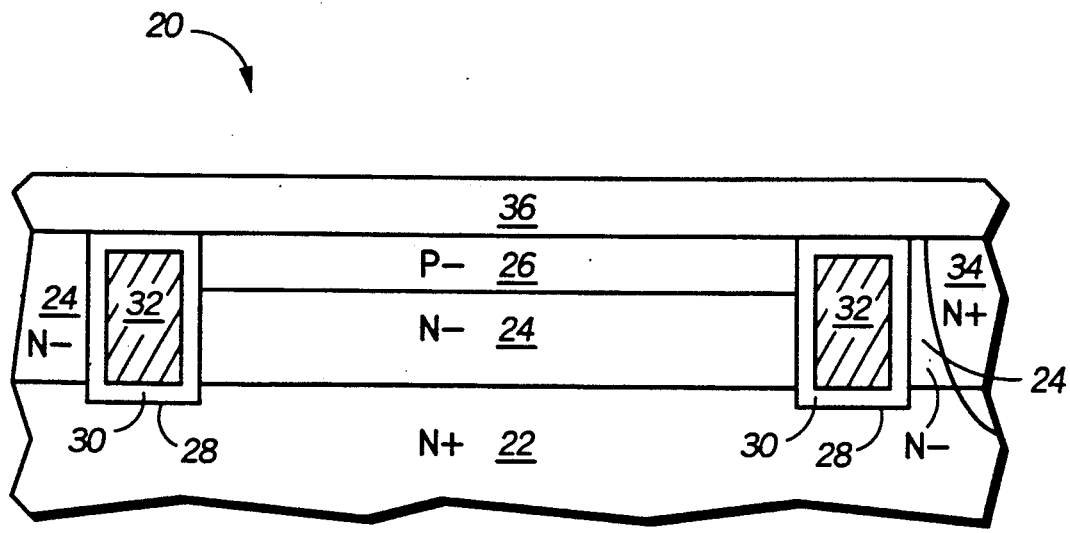
FIGS. 2(A-H) illustrate, in cross-sectional form, a method, in accordance with the present invention, for patterning submicron openings in the manufacture of a semiconductor device.

FIG. 2A illustrates, in cross-sectional form, a structure 20 which is formed on a single (N+) crystal silicon substrate 22. Structure 20, as shown in FIG. 2A provides a foundation upon which the method of the present invention is used to manufacture a true self-aligned emitter and base bipolar semiconductor device. A true self-aligned emitter and base transistor is one in which the emitter and the base are formed in the same region of material. Structure 20 has an epitaxial (N−) layer 24 deposited on substrate 22. The (N−) layer 24 has a surface region counterdoped by p type dopants to form a (P−) layer 26. Isolation trenches 28 have been etched into device 20 to prevent electrical leakage laterally across the surface of bipolar semiconductor device 20. Trenches 28 each contain an isolation oxide 30 which surrounds polysilicon or oxide filler material 32. It should be understood that the illustrated trench isolation is one of several known possible isolation techniques which may be used. A heavily doped (N+) region 34 which diffuses into substrate 22 functions as a good ohmic contact region between the substrate 22 and a transistor collector electrode contact, as yet not formed in the manufacturing process. A layer of undoped polysilicon 36 overlies structure 20 to provide a contact electrode to a bipolar transistor to be formed and also as a preparatory step in the utilization of the method of the present invention. Another advantage of the process sequence of the present invention is its full compatibility with a BICMOS processing sequence. In the BICMOS processing sequence, undoped polysilicon layer 36 can also function as a gate electrode of a CMOS device. Although specific conductivities are illustrated herein, it should be well understood that this is by way of example only.

Figure 2B:
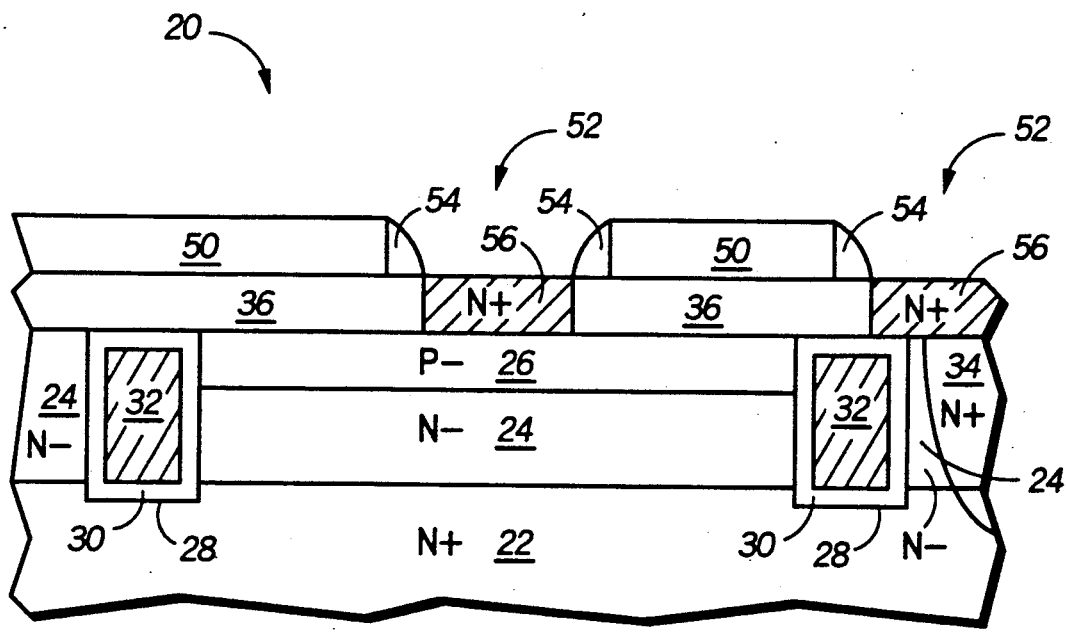

FIG. 2B illustrates, in cross-sectional form, further processing of structure 20. Structure 20 has an additional layer of material deposited which, in the preferred form, is a silicon nitride layer 50. Silicon nitride layer 50 has been deposited on undoped polysilicon layer 36 and has been patterned, using conventional photolithographic methods, to form a doping window 52. A known spacer method has been used to form spacers 54 including on sidewalls of doping window 52. In the preferred form, spacers 54 are formed from silicon dioxide. Conventional ion implantation has been used to dope exposed portions of undoped polysilicon layer 36 with an N type dopant, through window 52, to form emitter regions such as (N+) doped emitter regions 56. A predetermined one of the (N+) doped regions 56 subsequently function as a bipolar transistor emitter and another one of doped regions 56 subsequently functions as a collector contact.

Figure 2C:
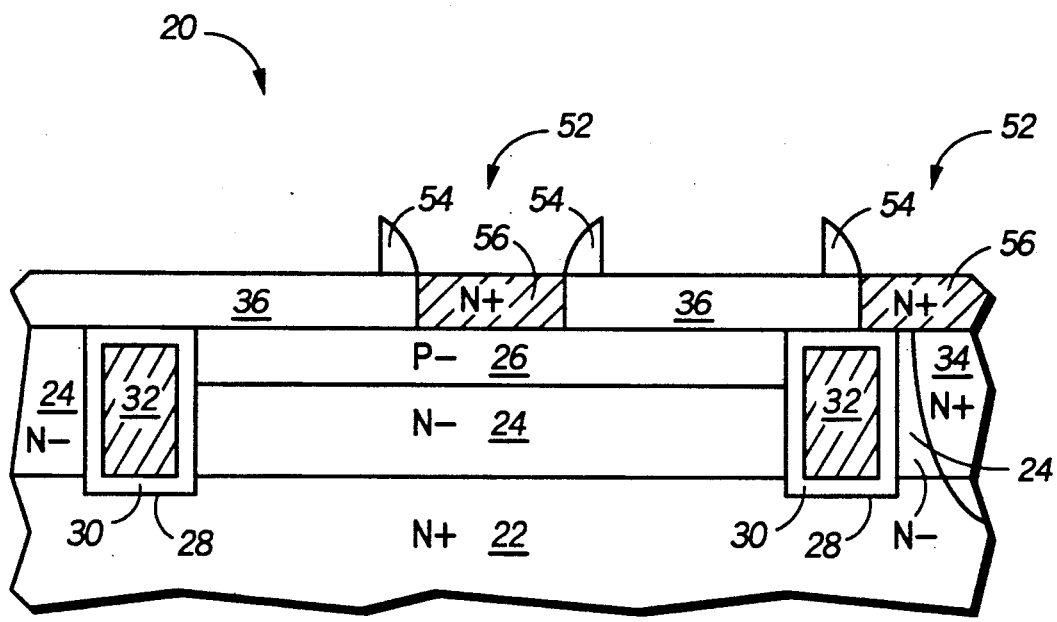

FIG. 2C illustrates, in cross-sectional form, further processing of structure 20. Structure 20 has had silicon nitride layer 50 removed by a conventional etching process using an etchant such as hot phosphoric acid. The structure has been completely rinsed to remove all trace chemicals such as phosphorus. Hot phosphoric acid has selectively etched silicon nitride layer 50 without etching spacers 54 so that a predetermined pattern of oxide spacers overlie undoped polysilicon layer 36. At this point, structure 20 has formed on the top surface a pattern which is a positive image of a predetermined mask.

Figure 2D:
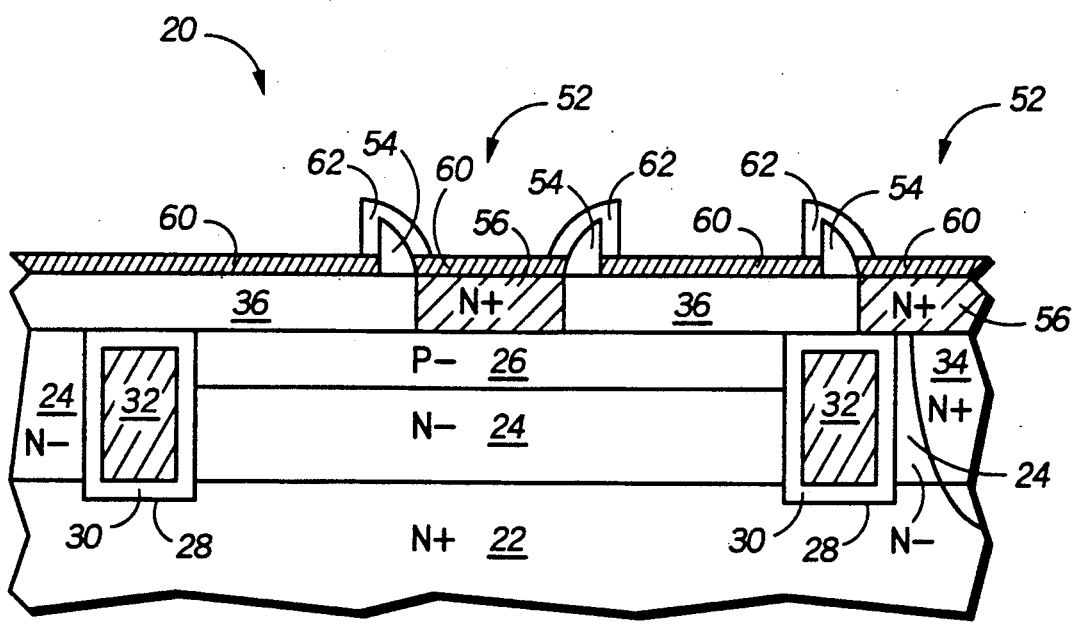

FIG. 2D illustrates, in cross-sectional form, further processing of structure 20. Structure 20 has an additional layer of material deposited, which in the preferred form, is approximately a 0.04 micron layer of cobalt to overlie portions of undoped polysilicon 36 and spacers 54. Structure 20 has been annealed at low temperature so that cobalt has reacted with exposed regions of undoped polysilicon 36 to form regions of cobalt silicide 60. During the annealing process, the oxide of spacer 54 has masked cobalt from the layer of undoped polysilicon 36, so that cobalt regions 62 have not reacted with polysilicon. The present invention utilizes the material properties of cobalt to advantage. A first advantage is due to the fact that cobalt reacts with silicon to form cobalt silicide which is extremely resistive to chemical etching. This feature of cobalt silicide allows the material to function as a negative image or an image reversal of the positive layer formed by spacers 54 of FIG. 2C. A second advantage is due to the fact that cobalt silicide is known to have a lower sheet resistance than polysilicon and therefore provides speed and device performance advantages. The processing advantages, as described, translate to several device performance improvements. The capability to form submicron openings, as taught in the present invention, is an improved use of cobalt silicide as a hard mask to form submicron openings. The ability to form submicron doping windows offers several advantages in the manufacture of economic high performance bipolar transistors such as improved speed performance, due to the use of cobalt silicide, and high cut-off frequency. Furthermore, the sequences of processes of the method of the present invention are fully compatible with BICMOS processes and offer other advantages to be discussed below.

Figure 2E:
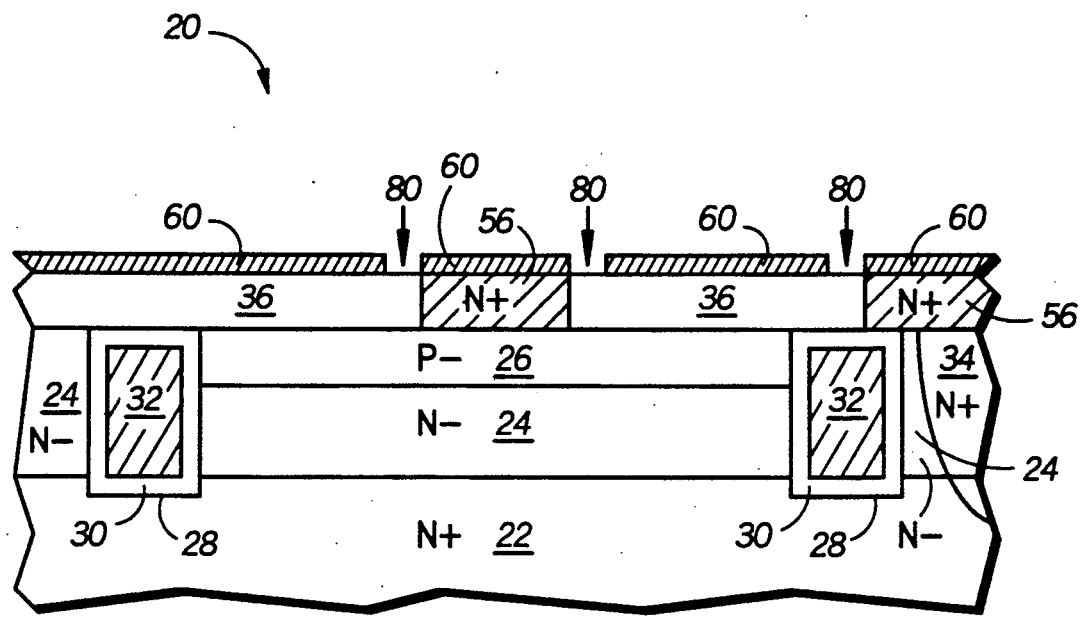
Figure 2F:
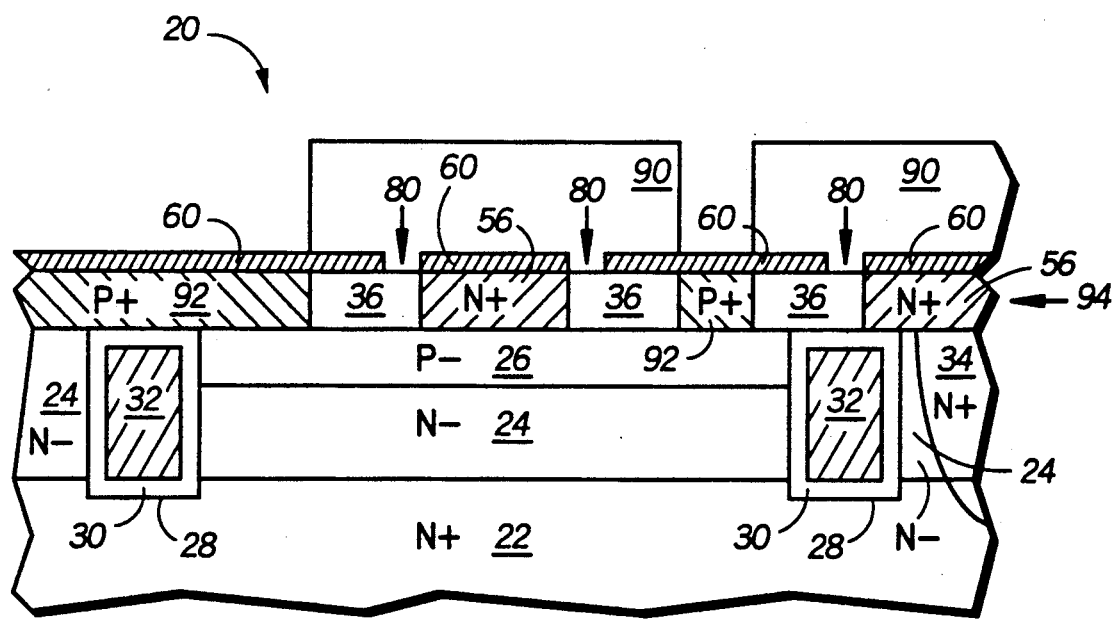

FIG. 2E illustrates, in cross-sectional form, further processing of structure 20. Structure 20 has been further processed by a chemical etchant, such as dilute nitric acid, to first remove unreacted cobalt regions 62 and then to remove oxide spacers 54. A hard mask is formed from the resulting pattern of submicron openings 80 and the surrounding layer of cobalt silicide 60. It should be noted that the openings 80 are not limited in dimension by resolution constraints of photolithographic equipment. Therefore, openings of 0.1 micron and less may readily be formed. At this point in the process, a negative image of the predetermined mask exists at the surface of structure 20. In other words, an image reversal layer has been formed on structure 20 which is a photographic opposite of the predetermined mask. FIG. 2F illustrates, in cross-sectional form, further processing of structure 20. Conventional photoresist processing has been used to pattern a resist mask 90 to overlie portions of structure 20. The purpose of photoresist mask 90 is to enable selective doping of regions of polysilicon layer 36 by conventional ion implantation to form (P+) doped regions 92. One of the (P+) doped regions 92 subsequently functions as a bipolar transistor base contact region. The dimensions of photoresist mask 90 are chosen so that the alignment of photoresist mask 90 to the hard mask cobalt silicide 60 is non-critical. Consequently, the photoresist mask 90 overlaps regions around submicron windows 80 and the (N+) doped regions 56 by a considerable amount. Therefore, portions of a polysilicon layer 94, such as remaining portions of undoped polysilicon layer 36, are masked from an ion implantation beam by photoresist mask 90. However, subsequent heat treatment causes dopants to diffuse sideways to that the undoped regions of polysilicon layer 94 are subsequently doped. In any event, any unimplanted portions of polysilicon layer 94, ultimately, do not affect the operation of structure 20.

Figure 2G:
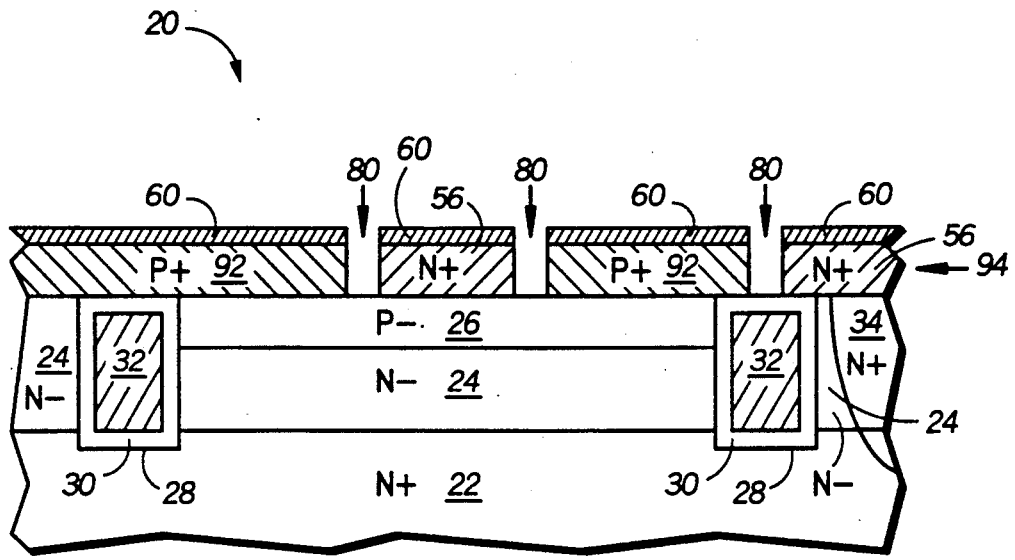

FIG. 2G illustrates, in cross-sectional form, further processing of structure 20. Photoresist mask 90 has been removed using conventional processing and all traces of photoresist material have been removed to ensure that submicron openings 80 are completely devoid of photoresist material. Conventional anisotropic etching has been used to transfer the pattern of the hard mask, formed by regions of cobalt silicide 60 overlying polysilicon layer 94, substantially into polysilicon layer 94. In this manner, submicron openings 80 delineate a transistor base contact provided by (P+) doped regions 92 and a transistor emitter provided by one of (N+) doped regions 56 which is in very close proximity. The submicron spacing between these two regions, which can be in the range 0.05 to 0.5 micron, cannot be resolved by conventional photolithography. The submicron separation of emitter and base regions offers performance advantages in the operation of bipolar transistors such as high cut-off frequency, lower base resistance and lower capacitances. Additionally, the control of the base-emitter separation affects the variability of the emitter-base electrical breakdown voltage, BVebo.

Figure 2H:
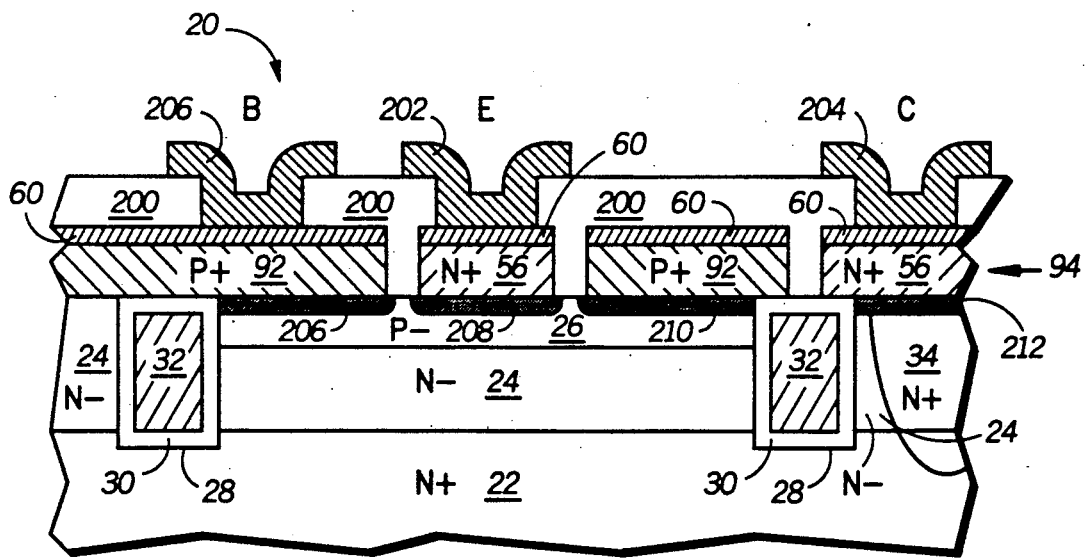

FIG. 2H illustrates, in cross-sectional form, further processing of structure 20. An additional layer of dielectric material 200 has been deposited onto the hard mask formed from regions of cobalt silicide 60. Conventional photolithographic methods have been used to pattern contact windows in the layer of dielectric material 200. A layer of aluminium (not fully shown) has been deposited on the layer of dielectric material 200. Conventional photolithographic methods have been used to pattern the layer of aluminium to form an emitter contact 202, a collector contact 204 and a base contact 206. To more fully illustrate collector contact 204, FIG. 2H has been slightly extended to the right from the FIG. 2G illustration. Conventional thermal annealing steps have activated the ion implanted doped regions during which time the dopants have diffused into (P−) layer 26 to form a base contact region 206, an emitter junction region 208, and a collector contact region 204.

In the illustrated form, structure 20 has several advantages. Base electrode 200 and emitter electrode 204 form a truly self-aligned transistor structure since these electrodes were formed from the same layer of polysilicon. The close proximity of the emitter and the base, which is a result of the application of the present invention, provides a high performance bipolar transistor having a high cut-off frequency, whilst maintaining control of the emitter-base breakdown voltage. Since only a single layer of polysilicon is used, the surface topography of structure 20 is relatively planar. Otherwise, overlying metal interconnecting lines (not shown) would be subject to a undulating surface topography which can cause metallization step-coverage and reliability problems.

By now it should be apparent that there has been provided a method, of the present invention, for patterning submicron openings which comprises a novel use of cobalt to provide an image reversal layer for the transformation of sidewall spacer lines into openings. The method utilizes properties of cobalt such as the selective reaction of cobalt with silicon and not with silicon dioxide to form a hard mask which is extremely resistive to chemical etching. The method of the present invention has many applications in the semiconductor industry such as in the formation of very closely spaced emitter-base bipolar transistors. Another advantage of the invention is the ability to form a truly self aligned emitter-base which is formed from the same layer of polysilicon. A further advantage is the compatibility of the method of the present invention with BICMOS processes. One particular feature of interest, with respect to BICMOS, is the ability to pattern gate electrodes of MOS transistors and emitter-base regions of bipolar transistors simultaneously. For example, a gate electrode of an MOS transistor may be defined by two of openings 80 surrounding one of (N+) doped regions 56.

It should be apparent that this invention is not restricted to cobalt but may be implemented with other transition metals. While there have been described herein the principles of the invention, it is to be clearly understood to those skilled in the art that this description is made only by way of example and not as a limitation to the scope of the invention. For example, the method of patterning submicron openings may equally well be applied to the manufacture of other semiconductor products and devices, such as gallium arsenide devices, germanium devices, superconducting devices, and even in related industries such as the manufacture of optical diffraction gratings. Accordingly, it is intended, by the appended claims, to cover all such modifications of the invention which fall within the true spirit and scope of the invention.

We claim:

1. A method for patterning a submicron opening within a first layer of material in a semiconductor device, comprising the steps of:

patterning a second layer of material overlying the first layer of material to define a window of a first dimension;

forming at least one sidewall spacer from a third layer of material along an edge of the window;

etching the second material while leaving the at least one sidewall spacer substantially intact;

depositing a fourth layer of material which selectively reacts with the second layer of material but not the at least one sidewall spacer to form a compound which functions as a hard mask;

removing unreacted portions of the fourth layer of material and the at least one sidewall spacer to expose a pedetermined portion of the first layer having a second dimension less than the first dimension, and selectively etching the first layer where exposed with an etch process which uses the hard mask provided by the fourth layer to form the small opening in the first layer.

2. The method of claim 1 wherein the step of depositing a fourth layer of material comprises depositing cobalt.

3. The method of claim 1 wherein the first layer of material in the semiconductor device consists of one of the group of polysilicon, amorphous silicon, or single-crystal silicon.

4. The method of claim 1 wherein the step of patterning a second layer of material comprises patterning one of silicon dioxide or silicon nitride.

5. The method of claim 1 wherein the step of forming at least one sidewall spacer from a third layer of material comprises using a material for the third layer which is different from the second layer of material, the material for the third layer comprising one of silicon nitride or silicon dioxide.

6. The method of claim 1 wherein the step of patterning a second layer of material comprises patterning the second layer to define a window having a width less than one micron.

7. The method of claim 1 wherein the submicron opening which is patterned separates an electrode of a bipolar transistor.

8. The method of claim 1 wherein the submicron opening which is patterned defines a side of a gate region of an MOS transistor.

9. A method for patterning at least one submicron opening in a semiconductor using an image reversal layer of material, comprising the steps of:
providing a first layer of material;
patterning a seocnd layer of material overlying the first layer of material to define a pattern image having at least one window with a predetermined dimension;
forming at least one sidewall spacer from a third layer of material along an edge of the at least one window;
etching the second material while leaving the at least one sidewall spacer substantially intact;
depositing a fourth layer of material which selectively reacts with the second layer of material but not the at least one sidewall spacer to form a compound which functions as a hard mask which is an image reversal of the pattern image;
removing unreacted portions of the fourth layer of material and the at least one sidewall spacer to expose a predetermined portion of the first layer having a seocnd dimension less than the first dimension, and
selectively etching the first layer where exposed with an etch process which uses the hard mask provided by the fourth layer to form the small opening in the first layer.

10. The method of claim 9 wherein the step of depositing a fourth layer of material comprises depositing cobalt.

11. The method of claim 9 wherein the first layer of material in the semiconductor device consists of one of the group of polysilicon, amorphous silicon, or single-crystal silicon.

12. The method of claim 9 wherein the step of patterning a second layer of material comprises patterning one of silicon dioxide or silicon nitride.

13. The method of claim 9 wherein the step of forming at least one sidewall spacer from a third layer of material comprises using a material for the third layer which is different from the second layer of material, the material for the third layer comprising one of silicon nitride or silicon dioxide.

14. The method of claim 9 wherein the step of patterning a second layer of material comprises patterning the second layer to define a window having a width less than one micron.

15. The method of claim 9 wherein the submicron opening which is patterned separates an electrode of a bipolar transistor.

16. The method of claim 9 wherein the submicron opening which is patterned defines a side of a gate region of an MOS transistor.

* * * * *